(12) United States Patent
Venkata et al.

(10) Patent No.: US 7,538,578 B2
(45) Date of Patent: May 26, 2009

(54) MULTIPLE DATA RATES IN PROGRAMMABLE LOGIC DEVICE SERIAL INTERFACE

(75) Inventors: Ramanand Venkata, San Jose, CA (US); Chong H Lee, San Ramon, CA (US); Rakesh H Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 872 days.

(21) Appl. No.: 11/177,034

(22) Filed: Jul. 8, 2005

(65) Prior Publication Data
US 2006/0233172 A1 Oct. 19, 2006

Related U.S. Application Data

(60) Provisional application No. 60/672,433, filed on Apr. 18, 2005.

(51) Int. Cl.
H03K 19/177 (2006.01)
G06F 13/42 (2006.01)

(52) U.S. Cl. .............................. 326/41; 326/86; 326/38; 326/39; 710/106; 710/305; 375/220

(58) Field of Classification Search .................. 326/38, 326/39, 41, 86; 710/105, 305
See application file for complete search history.

(56) References Cited

U.S. PATENT DOCUMENTS 6,724,328 B1   4/2004   Lui et al.
6,888,376 B1   5/2005   Venkata et al. ................ 326/41
7,162,553 B1 *  1/2007  Xue et al. ..................... 710/71
7,436,210 B2 * 10/2008  Venkata et al. ............... 326/38
7,461,192 B2 * 12/2008  Sobelman ................... 710/305
2005/0007996 A1  1/2005  Venkata et al.

FOREIGN PATENT DOCUMENTS

EP          1248372         10/2002

\* cited by examiner

Primary Examiner—Vibol Tan
(74) Attorney, Agent, or Firm—Ropes & Gray LLP; Jeffrey H. Ingerman (57) ABSTRACT

A serial interface for a programmable logic device can be operated according to various communications protocols and includes both a receiver portion and a transmitter portion. The receiver portion includes at least a word or byte alignment stage, a de-skew stage, a rate compensation or matching stage, a padded protocol decoder stage (e.g., 8B/10B decoder circuitry or 64B/66B decoder circuitry), a byte deserializer stage, a byte reorder stage, and a phase compensation stage. The transmitter portion includes at least a phase compensation stage, a byte deserializer stage, and a padded protocol encoder stage (e.g., an 8B/10B encoder circuitry or 64B/66B encoder circuitry). Each stage may have multiple occurrences of relevant circuitry. Selection circuitry, such as multiplexers, selects the appropriate stages, and circuitry within each stage, for the protocol being used.

45 Claims, 9 Drawing Sheets

MULTIPLE DATA RATES IN PROGRAMMABLE LOGIC DEVICE SERIAL INTERFACE

CROSS REFERENCE TO RELATED APPLICATION

This claims the benefit of copending, commonly-assigned U.S. Provisional Patent Application No. 60/672,433, filed Apr. 18, 2005, which is hereby incorporated by reference herein in its entirety.

BACKGROUND OF THE INVENTION

This invention relates to a high-speed serial interface, especially in a programmable logic device (PLD), which may operate at different data rates.

It has become common for PLDs to incorporate high-speed serial interfaces to accommodate high-speed (i.e., greater than 1 Gbps) serial I/O standards—e.g., the XAUI (Extended Attachment Unit Interface) standard. In accordance with the XAUI standard, a high-speed serial interface includes transceiver groups known as "quads," each of which includes four transceivers and some central logic.

In one implementation, each transceiver is divided into a physical medium attachment (PMA) portion or module which communicates with outside devices, and a physical coding sublayer (PCS) portion or module which performs serial processing of data, for transmission to, or that is received from, those outside devices. Currently available PMA modules and PCS modules overlap in terms of the data rates that each will support, but the maximum data rate of available PMA modules typically exceeds the maximum data rate of available PCS modules.

Commonly-assigned U.S. Pat. No. 6,888,376, hereby incorporated by reference herein in its entirety, discloses a serial interface in which, at higher data rates, two PCS modules are used with each PMA module. However, that solution leaves a PMA module corresponding to one of the two PCS modules unused, and reduces the number of channels in the interface by up to half, if all of the channels used in the device require higher data rates.

It would be desirable to be able to support currently available data rates in a programmable logic device serial interface without wasting up to half the capacity of the serial interface.

SUMMARY OF THE INVENTION

The present invention provides a high-speed serial interface of the type described, in a PLD, in which each PMA module is supported by a PCS module capable of handling the maximum data rate of the PMA module. However, because the maximum data rate is not always used, and because supporting different data rates may involve different blocks and settings in the interface, the invention provides a PCS module that may be configured for different data rates, notwithstanding those differences. In addition, the configurability of the PCS module may allow it to be configured for different standards, including the aforementioned XAUI standard, as well as the PCI-Express standard and other standards.

It is known to include within the PCS module, on the receiver side, one or more, as necessary, of word or byte alignment circuitry, de-skew circuitry, rate compensation or matching circuitry, a padded protocol decoder (e.g., an 8 B/10 B decoder or a 64 B/66 B decoder), byte deserializer circuitry, byte reorder circuitry, and phase compensation circuitry. These are used in appropriate combinations to process an incoming serial data stream that may be asynchronous and from which a clock may have been recovered, to break the serial data into properly aligned words or bytes which may then be processed, preferably in parallel, by the logic core of a programmable logic device.

Similarly, it is known to include in a PCS module, on the transmitter side, phase compensation circuitry, byte deserializer circuitry, and padded protocol encoder (e.g., an 8 B/10 B encoder or a 64 B/66 B encoder).

The specific structure of a particular PCS module is determined by the particular protocol or standard (e.g., XAUI, PCI-Express, or other) with which it is to be used. In accordance with the present invention, a PCS module preferably has at least one of each a plurality of different ones of the types of circuitry described above, and possibly other types of circuitry. Appropriate selector circuitry, preferably including multiplexers and bypass conductors, is provided to allow the PCS module to be configured for any of a number of protocols, preferably including the aforementioned XAUI and PCI-Express protocols and others.

In some cases, there may be more than one of the aforementioned types of circuitry in the configurable PCS module. For example, there may be two (or more) padded protocol decoders or encoders. Similarly, there may be more than one byte alignment circuit, or more than one rate match circuit. When there is more than one instance of a kind of circuitry, the different instances may be identical or different. In different configurations, only one instance might be used, or both might be used in parallel, or they may be cascaded together.

For example, in one embodiment there may be two identical padded protocol decoders (in the receiver) or encoders (in the transmitter), and on the receiver side there could be two identical rate match circuits. Also, there may be two word align circuits that in one embodiment could be identical, or in another embodiment could be different. For example, in the latter embodiment, the different word align circuits could process different word widths—e.g., one circuit might handle a word width that is twice that handled by the other circuit.

The various circuits preferably are interconnected in a way that allows the user to programmably select which of the circuits is used in a particular logic design for the programmable logic device. In a preferred embodiment, a multiplexer downstream of each particular circuit can programmably select, as the input to the next circuit, either an output of the particular circuit or a bypass path around the particular circuit. In that way, each circuit may be included or excluded from the user logic design. In a case where more than one instance of a certain type of circuit is provided, the bypass path may be of a first data width, while the path through each instance is of a second data width (e.g., half the first data width), particularly where the two instances are identical. In a case where the two instances are different, such as the aforementioned case of word alignment circuits of different widths, the paths through the two instances preferably would be different.

Thus, in accordance with the present invention there is provided a configurable serial interface receiver for use in a programmable logic device. The serial interface receiver includes a plurality of stages, at least some of which are selected from the group consisting of a word alignment stage having at least one block providing word-aligned output, a de-skew stage having at least one block providing de-skewed output, a rate matching stage having at least one block providing rate-matched output, a padded protocol decoder stage having at least one block providing decoded output, a byte deserializer stage having at least one block providing deserialized output, a byte reorder stage having at least one block providing reordered output and a phase compensation stage having at least one block providing phase-compensated output. There is bypass circuitry around each said stage, and selector circuitry associated with each said stage selects, with respect to that stage, between output of that stage and the bypass circuitry around that stage. As a result, any one of the plurality of stages is programmably includable in the configurable serial interface receiver.

There is also provided configurable serial interface transmitter for use in a programmable logic device. The serial interface transmitter includes a plurality of stages, at least some of which are selected from the group consisting of a phase compensation stage having at least one block providing phase-compensated output, a byte serializer stage having at least one block providing serialized output, and a padded protocol encoder stage having at least one block providing encoded output. Bypass circuitry is provided around each said stage. Selector circuitry associated with each stage allows selection, with respect to that stage, between output of that stage and the bypass circuitry around that stage, whereby any one of the plurality of stages is programmably includable in the configurable serial interface transmitter.

A programmable logic device incorporating an interface having such a receiver or transmitter is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides a high-speed serial interface that serves a wide range of data rates by providing a PCS module that can be configured for different protocols depending on the requirements of the particular user logic design. Thus, rather than having to use multiple PCS modules as described above to support a single PMA module, or having to support the maximum data rate in each PCS module where such a PCS module might not function well at lower data rates, the configurable PCS module according to the invention can be configured by the user, as part of the logic design of the programmable logic device of which the configurable interface is a part, for the protocol that matches the data rate requirements of the design.

The invention will now be described with reference to FIGS. 1-8.

Figure 1:
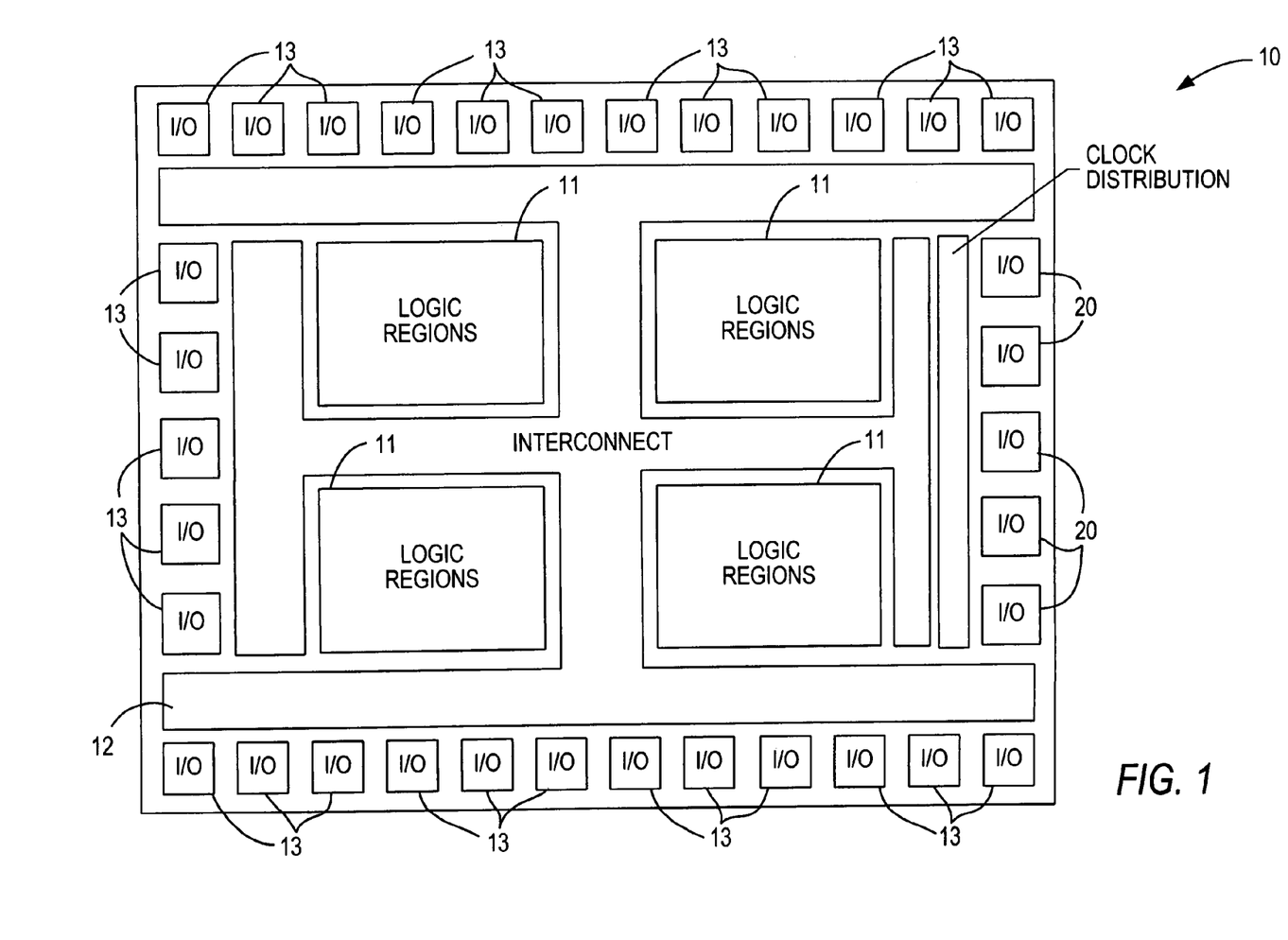
FIG. 1 is a block diagram of a preferred embodiment of a programmable logic device in which the present invention can be used.

PLD 10, shown schematically in FIG. 1, is one example of a device including a serial interface 20 incorporating the invention. PLD 10 has a programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection.

Figure 2:
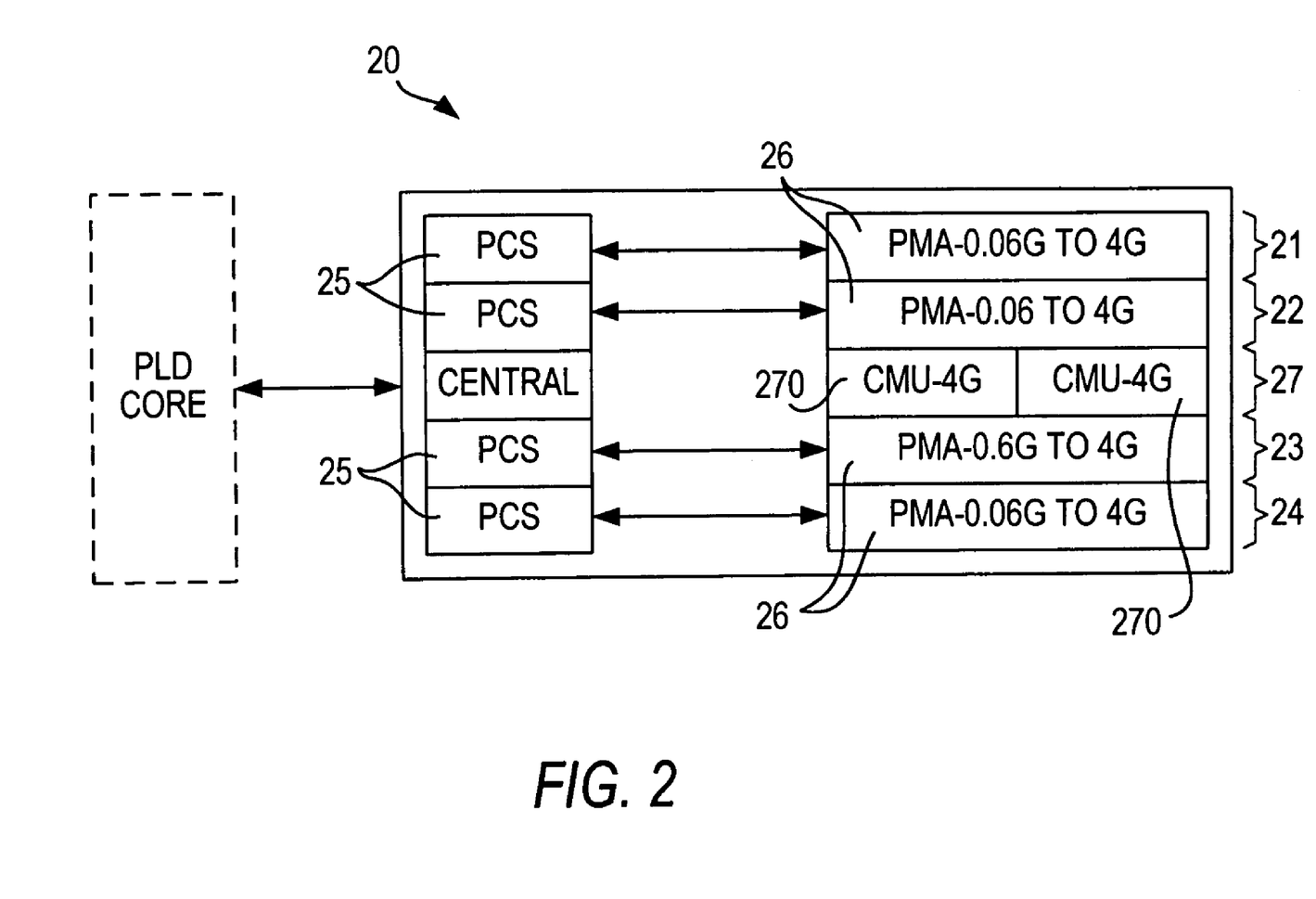
FIG. 2 is a schematic diagram of a serial interface incorporating the present invention.

For example, as shown in FIG. 2, each I/O region 20 preferably is a high-speed serial interface as described above, preferably including four channels 21-24, each including its own PCS module 25 and PMA module 26. Central logic 27, including at least one clock management unit 270 (in the embodiment shown, two), preferably is shared by channels 21-24.

Figure 3:
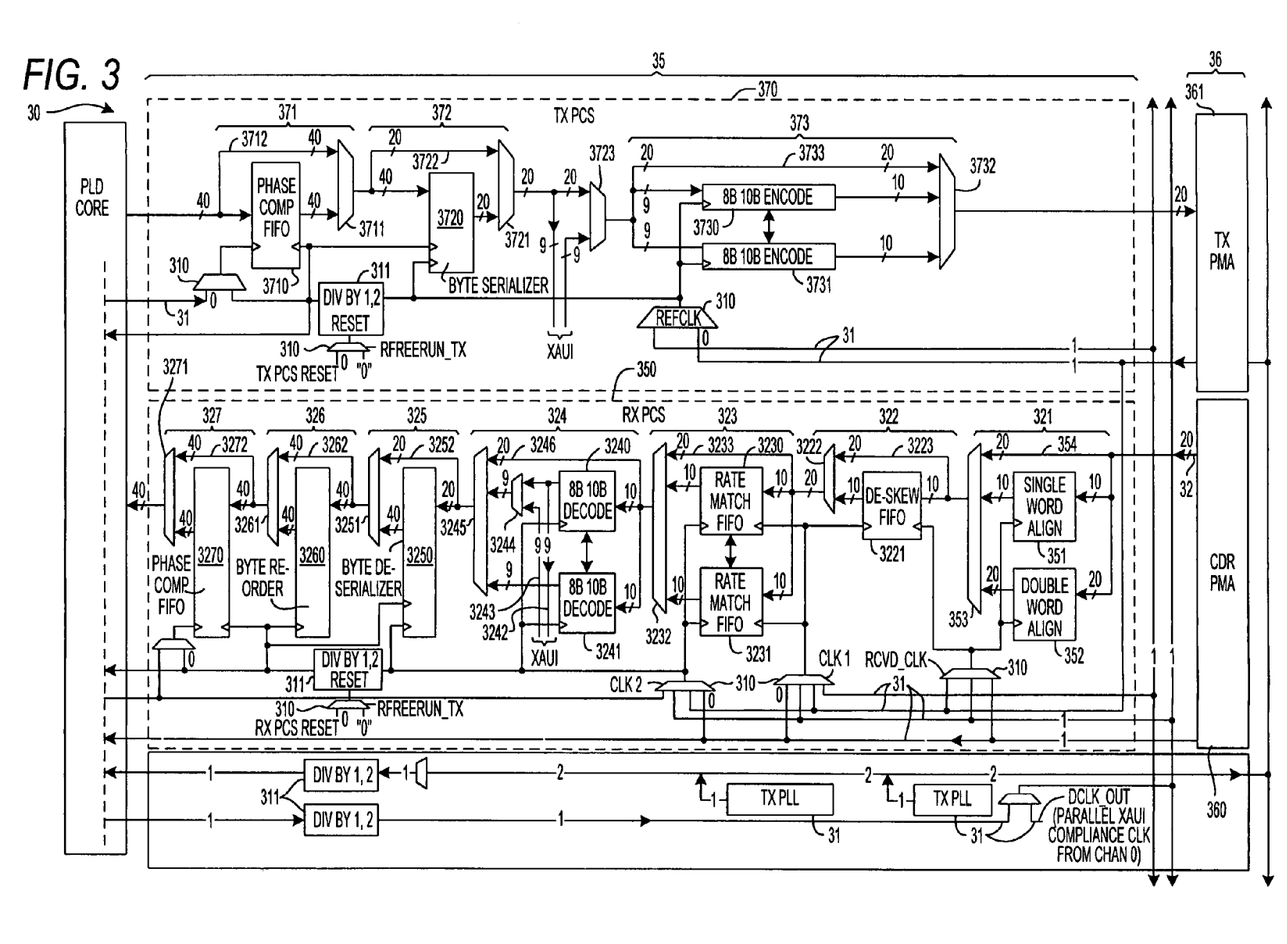
FIG. 3 is a schematic diagram of a preferred embodiment of one channel of a serial interface in accordance with the present invention.

FIG. 3 shows the details of one channel 30 which may be any of channels 21-24, and which preferably includes its own PCS module 35 and PMA module 36 corresponding to any of PCS modules 25 and PMA modules 26. The various clock inputs 31 preferably come from clock management unit 270 of central logic 27, or from the logic core of PLD 10. The various multiplexers 310 and dividers 311 allow selection of the appropriate clock speed or frequency for the protocol being used.

Preferably, PCS module 35 includes PCS receiver portion 350 and PCS transmitter portion 370. Receiver portion 350 preferably receives up to twenty bits on bus 32 from receiver PMA portion 360. PCS receiver portion 350 preferably includes a word or byte alignment stage 321 including single word align circuit 351, double word alignment circuit 352, and multiplexer 353 which allows user-controlled selection of bypass conductor 354 or one of word alignment circuits 351, 352.

Next, at the output of multiplexer 353, PCS receiver portion 350 preferably includes deskew stage 322 including deskew FIFO circuit 3221 and multiplexer 3222 which allows user-controlled selection of bypass conductor 3223. In the embodiment shown, the output of mutliplexer 353 is twenty bits wide, as is bypass conductor 3223, while deskew FIFO 3221 is ten bits wide. Thus, in this embodiment, deskew FIFO 3221 preferably is used only for ten-bit-wide data.

Next, at the output of multiplexer 3222, PCS receiver portion 350 preferably includes rate match stage 323 including two rate matching FIFO circuits 3230, 3231, and multiplexer 3232 which allows user-controlled selection of bypass conductor 3233 or the outputs of one or both of rate matching FIFO circuits 3230, 3231. Thus in a case of twenty-bit-wide data, the data can bypass the rate matching stage 323 or be processed by the two rate matching FIFOs 3230, 3231, while in the case of ten-bit-wide data, the data can bypass the rate matching stage 323 or be processed by one of the two rate matching FIFOs 3230, 3231.

Next, at the output of multiplexer 3232, PCS receiver portion 350 preferably includes padded protocol decoding stage 324 including two padded protocol decoders 3240, 3241 (in the illustration, two 8 B/10 B decoders). The output of one decoder 3240 preferably can be diverted at 3242 to additional XAUI circuitry (not shown, but preferably located in central channel 27) whence it returns at 3243 to XAUI-mode selection multiplexer 3244 which allows selection of either the raw output of decoder 3240 or the output of the additional XAUI circuitry. A multiplexer 3245 preferably allows selection of bypass conductor 3246, or one or both of XAUI-mode selection multiplier 3244 and decoder 3241.

Next, at the output of multiplexer 3245, PCS receiver portion 350 preferably includes byte deserializer stage 325 including byte deserializer circuit 3250, as well as multiplexer 3251 allowing selection of bypass conductor 3252 or the output of byte deserializer circuit 3250.

Next, at the output of multiplexer 3251, PCS receiver portion 350 preferably includes byte reorder stage 326 including byte reorder circuit 3260, as well as multiplexer 3261 allowing selection of bypass conductor 3262 or the output of byte reorder circuit 3260.

Next, at the output of multiplexer 3261, PCS receiver portion 350 preferably includes phase compensation stage 327 including phase compensation FIFO circuit 3270, as well as multiplexer 3271 allowing selection of bypass conductor 3272 or the output of phase compensation FIFO 3270.

PCS transmitter portion 370 preferably includes a phase compensation stage 371 including phase compensation FIFO circuit 3710, as well as multiplexer 3711 allowing selection of bypass conductor 3712 or the output of phase compensation FIFO 3710.

Next, at the output of multiplexer 3711, PCS transmitter portion 370 preferably includes a byte serialization stage 372 including byte serializer 3720, as well as multiplexer 3721 allowing selection of bypass conductor 3722 or the output of byte serializer 3720. At the output of multiplexer 3721 is an additional XAUI-mode selection multiplexer 3723, which allows the selection of the output of multiplexer 3721 or that same output after diversion to additional XAUI circuitry (not shown) in XAUI mode.

Next, at the output of multiplexer 3723, PCS transmitter portion 370 preferably includes a padded-protocol encoding stage 373 including two padded protocol encoders 3730, 3731 (in the illustration, two 8 B/10 B encoders). A multiplexer 3732 preferably allows selection of bypass conductor 3733, or one or both of encoders 3730, 3731, as the output of PCS transmitter portion 370 to PMA transmitter portion 361.

Figure 4:
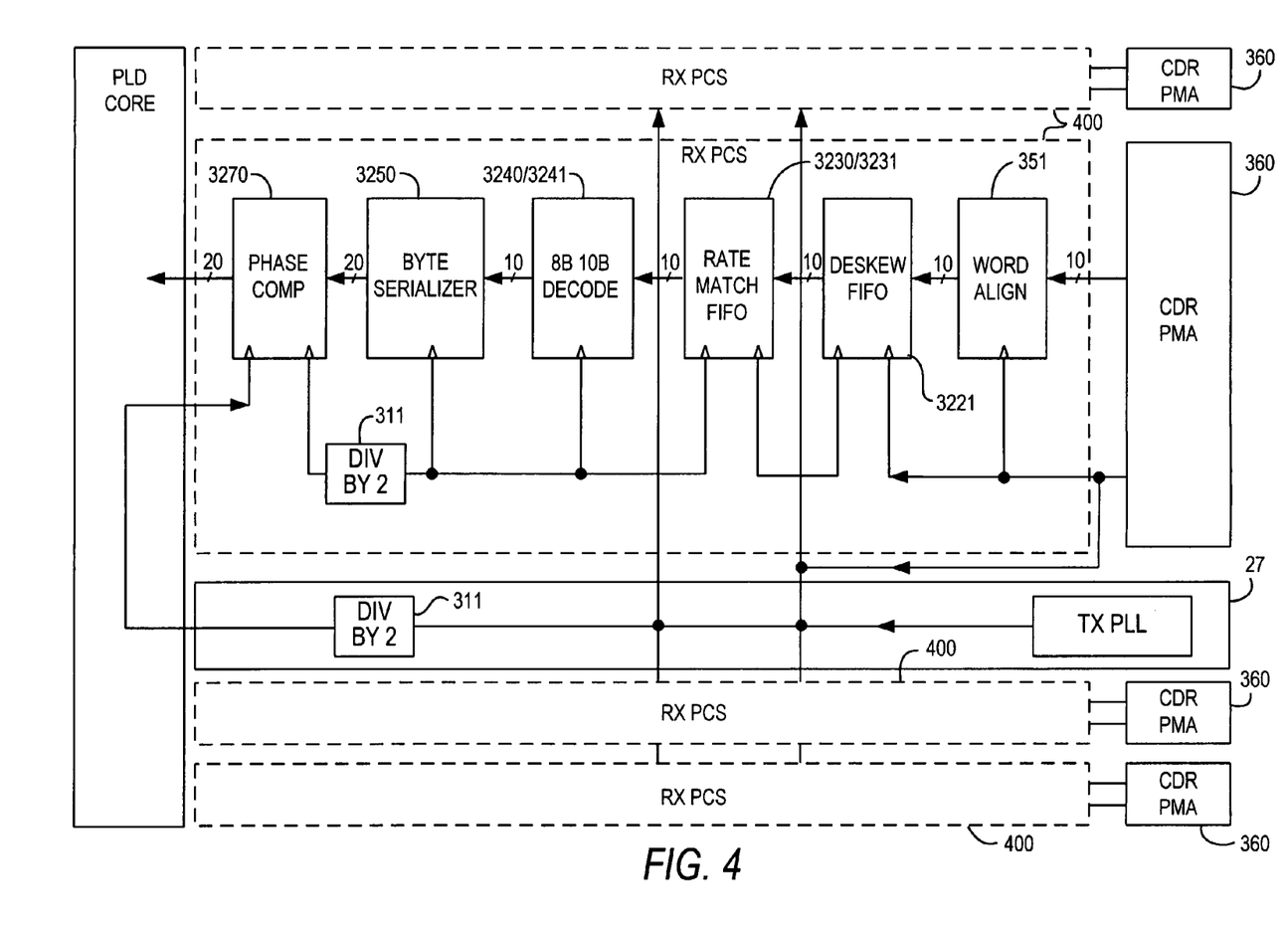
FIG. 4 is a schematic diagram of the receiver portion of the embodiment of FIG. 3 configured for the XAUI protocol.

FIG. 4 shows a configuration 400 of PCS receiver portion 350 in XAUI mode. PCS receiver configuration 400 includes single word align circuit 351, deskew FIFO 3221, one of rate matching FIFO circuits 3230, 3231, one of padded-protocol decoders 3240, 3241 (in this case an 8 B/10 B decoder), byte deserializer circuit 3250, and phase compensation FIFO circuit 3270. For simplicity, multiplexer 3244 and the connections 3242, 3243 to the aforementioned additional XAUI circuitry in central channel 27 are not shown in FIG. 4, but they are present. There is no byte reorder stage in configuration 400. The clock derived by the transmitter phase-locked loop (PLL) in central logic 27 is used as one clock for rate matching FIFO circuit 3230 or 3231, and as the clock for decoder 3240 or 3241 and deserializer 3250. One-half that clock, as divided by divider 401, is used as one clock input to phase compensation FIFO circuit 3270. The same clock, divided by divider 402 and processed through the PLD core logic, is used as another clock input to phase compensation FIFO circuit 3270. The depiction of configuration 400 in FIG. 4 is the logical result of setting the various multiplexers of FIG. 3 to make various input selections; the multiplexers are present, but not shown in FIG. 4.

Figure 5:
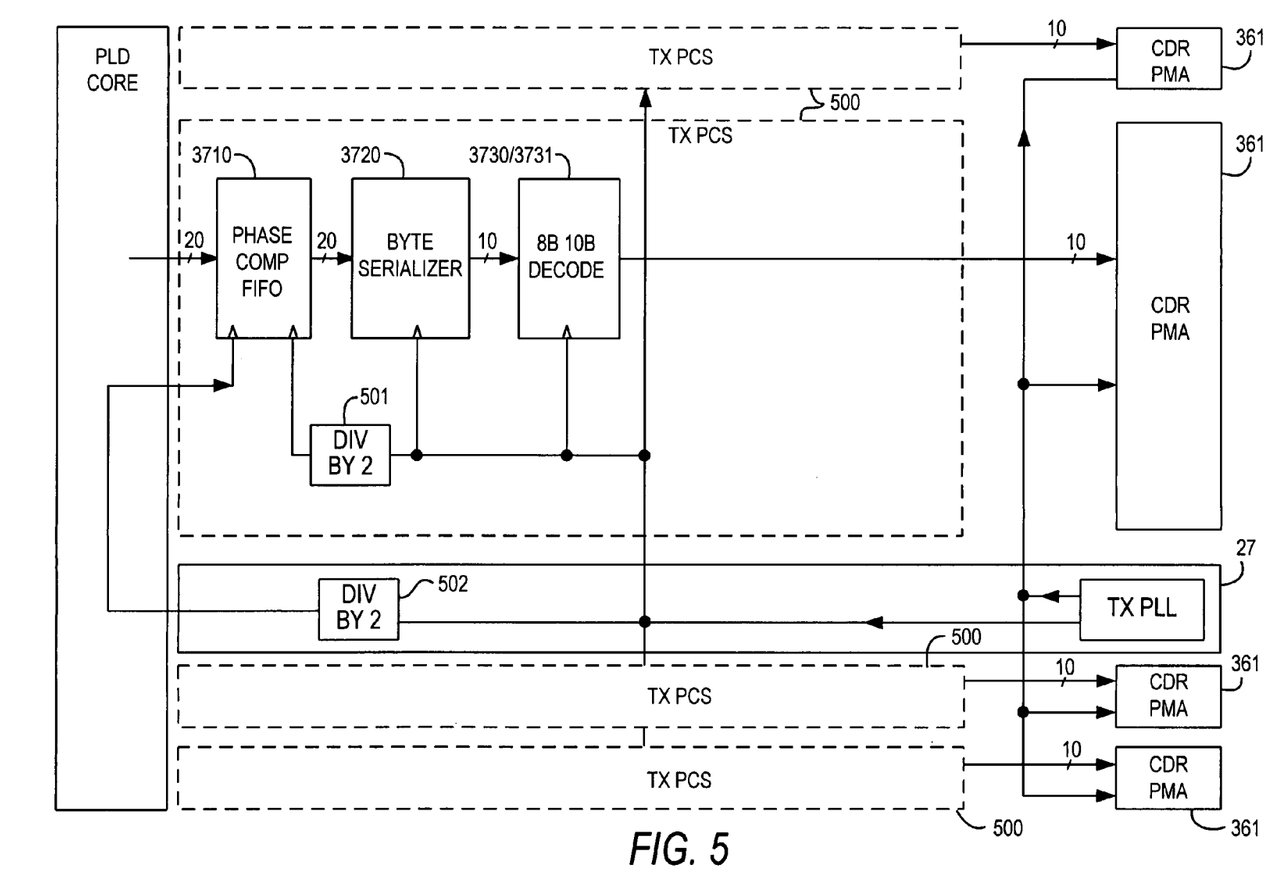
FIG. 5 is a schematic diagram of the transmitter portion of the embodiment of FIG. 3 configured for the XAUI protocol.

FIG. 5 shows a configuration 500 of PCS transmitter portion 370 in XAUI mode. PCS transmitter configuration 500 includes phase compensation FIFO circuit 3710, byte serializer circuit 3720, and one of 8 B/10 B encoders 3730, 3731. For simplicity, multiplexer 3723 and its connections to the aforementioned additional XAUI circuitry in central channel 27 are not shown in FIG. 5, but they are present. The clock derived by the transmitter phase-locked loop (PLL) in central logic 27 is used as the clock for byte serializer circuit 3720, and encoder 3730 or 3731. One-half that clock, as divided by divider 501, is used as one clock input to phase compensation FIFO circuit 3710. The same clock, divided by divider 502 and processed through the PLD core logic, is used as another clock input to phase compensation FIFO circuit 3710. The depiction of configuration 500 in FIG. 5 is the logical result of setting the various multiplexers of FIG. 3 to make various input selections; the multiplexers are present, but not shown in FIG. 5.

Figure 6:
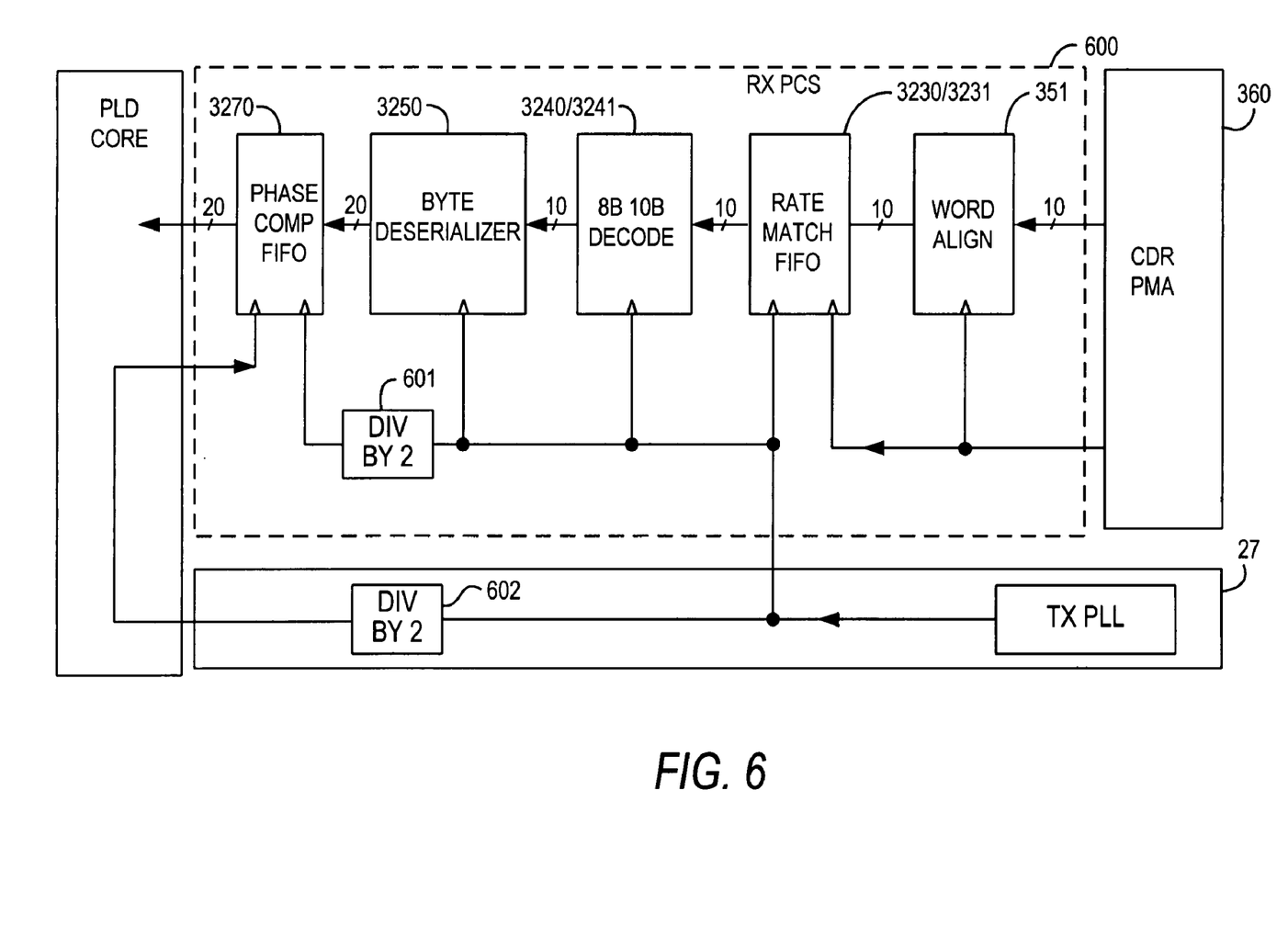
FIG. 6 is a schematic diagram of the receiver portion of the embodiment of FIG. 3 configured for the PCI-Express protocol.

FIG. 6 shows a configuration 600 of PCS receiver portion 350 in PCI-Express mode. PCS receiver configuration 600 includes single word align circuit 351, one of rate matching FIFO circuits 3230, 3231, one of padded-protocol decoders 3240, 3241 (in this case an 8 B/10 B decoder), byte deserializer circuit 3250, and phase compensation FIFO circuit 3270. There is no deskew stage or byte reorder stage in configuration 600. The clock derived by the transmitter phase-locked loop (PLL) in central logic 27 is used as one clock for rate matching FIFO circuit 3230 or 3231, and as the clock for decoder 3240 or 3241 and deserializer 3250. One-half that clock, as divided by divider 601, is used as one clock input to phase compensation FIFO circuit 3270. The same clock, divided by divider 602 and processed through the PLD core logic, is used as another clock input to phase compensation FIFO circuit 3270. The depiction of configuration 600 in FIG. 6 is the logical result of setting the various multiplexers of FIG. 3 to make various input selections; the multiplexers are present, but not shown in FIG. 6.

Figure 7:
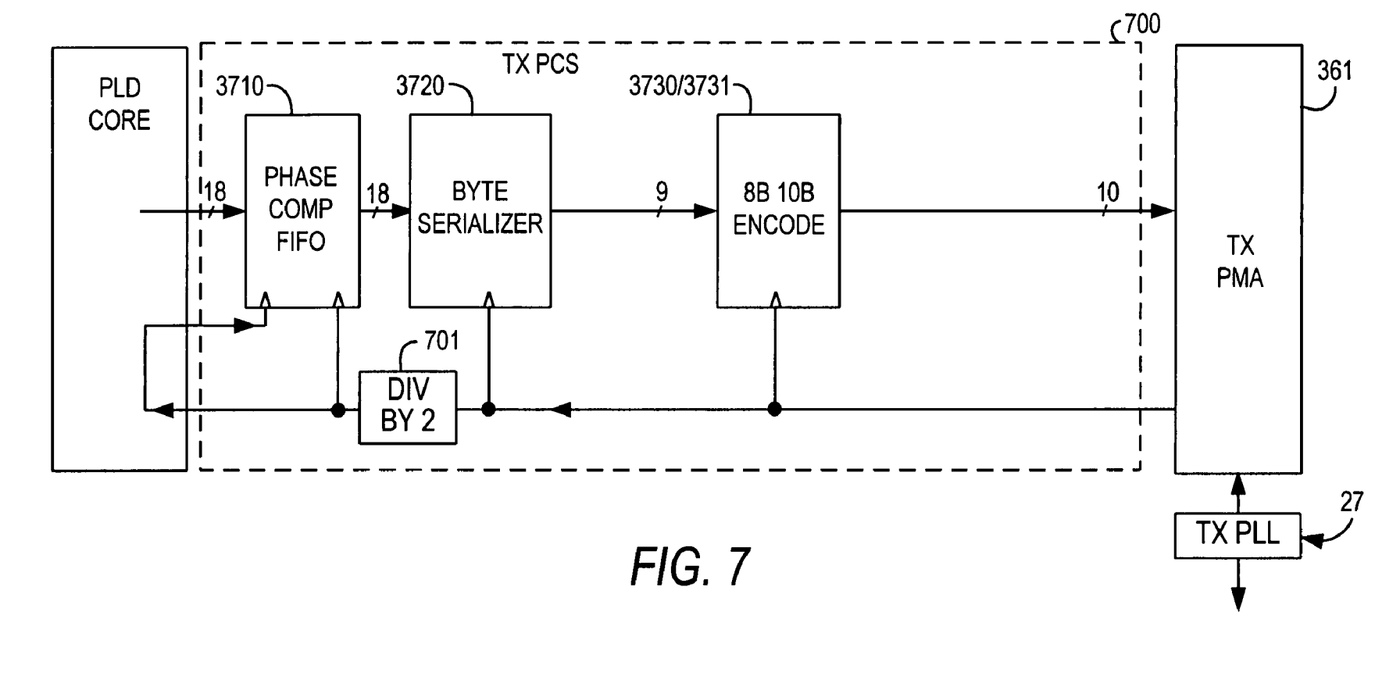
FIG. 7 is a schematic diagram of the transmitter portion of the embodiment of FIG. 3 configured for the PCI-Express protocol.

FIG. 7 shows a configuration 700 of PCS transmitter portion 370 in PCI-Express mode. PCS transmitter configuration 700 includes phase compensation FIFO circuit 3710, byte serializer circuit 3720, and one of 8 B/10 B encoders 3730, 3731. The clock derived by the transmitter phase-locked loop (PLL) in central logic 27 is used as the clock for byte serializer circuit 3720, and encoder 3730 or 3731. One-half that clock, as divided by divider 701, is used as one clock input to phase compensation FIFO circuit 3710. That same divided clock, processed through the PLD core logic, is used as another clock input to phase compensation FIFO circuit 3710. The depiction of configuration 700 in FIG. 7 is the logical result of setting the various multiplexers of FIG. 3 to make various input selections; the multiplexers are present, but not shown in FIG. 7.

Figure 8:
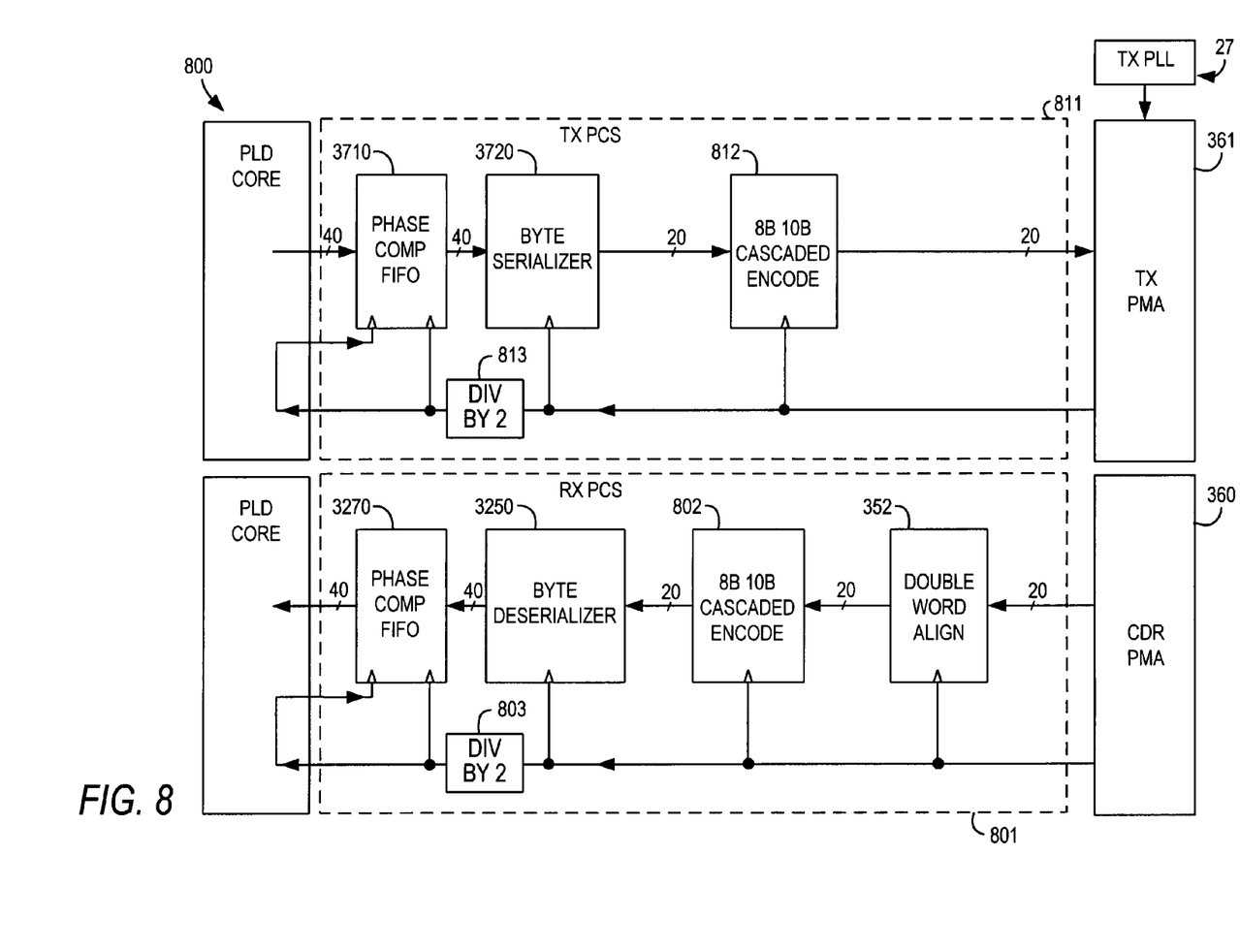
FIG. 8 is a schematic diagram of the embodiment of FIG. 3 configured for a custom protocol.

FIG. 8 shows a configuration 800 of one channel of a PCS module for a "custom 8 B/10 B" protocol. Receiver portion 801 of configuration 800 preferably includes double word alignment circuit 352, cascaded 8 B/10 B decoder 802 (a cascade of decoders 3240, 3241), byte deserializer circuit 3250, and phase compensation FIFO circuit 3270. There is no deskew stage or byte reorder stage in configuration 600. The clock derived by the transmitter phase-locked loop (PLL) in central logic 27 is used as the clock for the word alignment, decoder and deserializer stages, while one-half that clock, as divided by divider 803, is used as one clock input to phase compensation FIFO circuit 3270. The same divided clock, processed through the PLD core logic, is used as another clock input to phase compensation FIFO circuit 3270.

Transmitter portion 811 of configuration 800 includes phase compensation FIFO circuit 3710, byte serializer circuit 3720, and cascaded 8 B/10 B encoder 812 (a cascade of encoders 3730, 3731). The clock derived by the transmitter phase-locked loop (PLL) in central logic 27 is used as the clock for byte serializer circuit 3720, and encoder 812. One-half that clock, as divided by divider 813, is used as one clock input to phase compensation FIFO circuit 3710. That same divided clock, processed through the PLD core logic, is used as another clock input to phase compensation FIFO circuit 3710.

The depiction of configuration 800 in FIG. 8 is the logical result of setting the various multiplexers of FIG. 3 to make various input selections; the multiplexers are present, but not shown in FIG. 8.

A PLD 10 incorporating interfaces 20 according to the present invention may be used in many kinds of electronic devices. One possible use is in a data processing system 900 shown in FIG. 9. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

Figure 9:
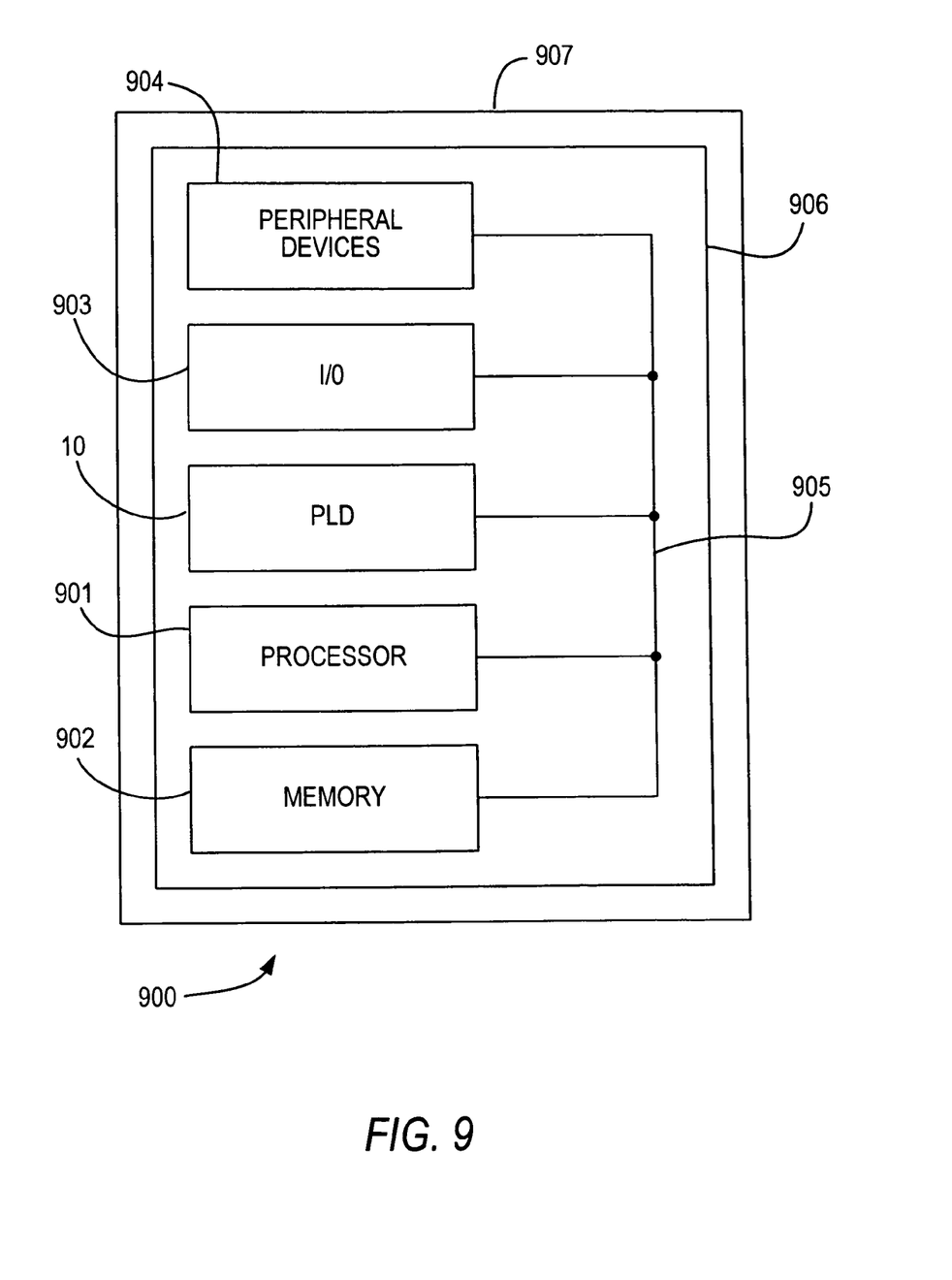
FIG. 9 is a simplified block diagram of an illustrative system employing a programmable logic device incorporating a serial interface in accordance with the present invention.

System 900 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 901. PLD 10 may also be used as an arbiter for arbitrating access to a shared resources in system 900. In yet another example, PLD 10 can be configured as an interface between processor 901 and one of the other components in system 900. It should be noted that system 900 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A configurable serial interface receiver for use in a programmable logic device, said serial interface receiver comprising:
   a plurality of stages selected from the group consisting of a word alignment stage comprising at least one block providing word-aligned output, a de-skew stage comprising at least one block providing de-skewed output, a rate matching stage comprising at least one block providing rate-matched output, a padded protocol decoder stage comprising at least one block providing decoded output, a byte deserializer stage comprising at least one block providing deserialized output, a byte reorder stage comprising at least one block providing reordered output and a phase compensation stage comprising at least one block providing phase-compensated output;
   bypass circuitry around each said stage; and
   selector circuitry associated with each said stage for selecting, with respect to said stage, between output of said stage and said bypass circuitry around said stage; whereby:
   any one of said plurality of stages is programmably includable in said configurable serial interface receiver.

2. The configurable serial interface receiver of claim 1 wherein:
   at least one of said plurality of stages comprises a plurality of said respective at least one block; and
   said selector circuitry allows selection of any one or more of said plurality of said respective at least one block.

3. The configurable serial interface receiver of claim 2 wherein said padded protocol stage comprises a plurality of said block providing decoded output.

4. The configurable serial interface receiver of claim 3 wherein said padded protocol stage comprises two of said block providing decoded output.

5. The configurable serial interface receiver of claim 3 wherein said rate matching stage comprises a plurality of said block providing rate-matched output.

6. The configurable serial interface receiver of claim 5 wherein said rate matching stage comprises two of said block providing rate-matched output.

7. The configurable serial interface receiver of claim 3 wherein said word alignment stage comprises a plurality of said block providing word-aligned output.

8. The configurable serial interface receiver of claim 7 wherein said word alignment stage comprises two of said block providing word-aligned output.

9. The configurable serial interface receiver of claim 8 wherein said two blocks providing word-aligned output are identical.

10. The configurable serial interface receiver of claim 8 wherein said two blocks providing word-aligned output are different.

11. The configurable serial interface receiver of claim 10 wherein one of said blocks providing word-aligned output is a single-word alignment block and one of said blocks providing word-aligned output is a double-word alignment block.

12. The configurable serial interface receiver of claim 2 wherein all said respective at least one block are identical.

13. The configurable serial interface receiver of claim 2 wherein each said respective at least one block is different.

14. The configurable serial interface receiver of claim 2 wherein said selector circuitry comprises a multiplexer.

15. The configurable serial interface receiver of claim 1 wherein said selector circuitry comprises a multiplexer.

16. The configurable serial interface receiver of claim 1 comprising:
   a single-word alignment block and a double-word alignment block in said word alignment stage;
   a single de-skew block in said de-skew stage;
   two rate matching blocks in said rate matching stage;
   two decoder blocks in said padded protocol decoder stage;
   a single deserializer block in said byte deserializer stage;
   a single byte reorder block in said byte reorder stage; and
   a single phase compensation block in said phase compensation stage.

17. A configurable serial interface transmitter for use in a programmable logic device, said serial interface transmitter comprising:
   a plurality of stages selected from the group consisting of a phase compensation stage comprising at least one block providing phase-compensated output, a byte serializer stage comprising at least one block providing serialized output, and a padded protocol encoder stage comprising at least one block providing encoded output;

bypass circuitry around each said stage; and selector circuitry associated with each said stage for selecting, with respect to said stage, between output of said stage and said bypass circuitry around said stage; whereby:

any one of said plurality of stages is programmably includable in said configurable serial interface transmitter.

18. The configurable serial interface transmitter of claim 17 wherein:

at least one of said plurality of stages comprises a plurality of said respective at least one block; and said selector circuitry allows selection of any one or more of said plurality of said respective at least one block.

19. The configurable serial interface transmitter of claim 18 wherein said padded protocol stage comprises a plurality of said block providing encoded output.

20. The configurable serial interface transmitter of claim 19 wherein said padded protocol stage comprises two of said block providing encoded output.

21. The configurable serial interface transmitter of claim 18 wherein all said respective at least one block are identical.

22. The configurable serial interface transmitter of claim 18 wherein each said respective at least one block is different.

23. The configurable serial interface transmitter of claim 18 wherein said selector circuitry comprises a multiplexer.

24. The configurable serial interface transmitter of claim 17 wherein said selector circuitry comprises a multiplexer.

25. The configurable serial interface transmitter of claim 17 comprising:

a single phase compensation block in said phase compensation stage;

a single serializer block in said byte serializer stage; and a single encoder block in said padded protocol encoder stage.

26. A programmable logic device comprising the serial interface transmitter of claim 17.

27. A digital processing system comprising:

processing circuitry;

a memory coupled to said processing circuitry; and a programmable logic device as defined in claim 26 coupled to the processing circuitry and the memory.

28. A printed circuit board on which is mounted a programmable logic device as defined in claim 26.

29. The printed circuit board defined in claim 28 further comprising:

memory circuitry mounted on the printed circuit board and coupled to the programmable logic device.

30. The printed circuit board defined in claim 29 further comprising:

processing circuitry mounted on the printed circuit board and coupled to the memory circuitry.

31. An integrated circuit device comprising the serial interface transmitter of claim 17.

32. A digital processing system comprising:

processing circuitry;

a memory coupled to said processing circuitry; and an integrated circuit device as defined in claim 31 coupled to the processing circuitry and the memory.

33. A printed circuit board on which is mounted an integrated circuit device as defined in claim 31.

34. The printed circuit board defined in claim 33 further comprising:

memory circuitry mounted on the printed circuit board and coupled to the integrated circuit device.

35. The printed circuit board defined in claim 34 further comprising:

processing circuitry mounted on the printed circuit board and coupled to the memory circuitry.

36. A programmable logic device comprising the serial interface receiver of claim 1.

37. A digital processing system comprising:

processing circuitry;

a memory coupled to said processing circuitry; and a programmable logic device as defined in claim 36 coupled to the processing circuitry and the memory.

38. A printed circuit board on which is mounted a programmable logic device as defined in claim 36.

39. The printed circuit board defined in claim 38 further comprising:

memory circuitry mounted on the printed circuit board and coupled to the programmable logic device.

40. The printed circuit board defined in claim 39 further comprising:

processing circuitry mounted on the printed circuit board and coupled to the memory circuitry.

41. An integrated circuit device comprising the serial interface receiver of claim 1.

42. A digital processing system comprising:

processing circuitry;

a memory coupled to said processing circuitry; and an integrated circuit device as defined in claim 41 coupled to the processing circuitry and the memory.

43. A printed circuit board on which is mounted an integrated circuit device as defined in claim 41.

44. The printed circuit board defined in claim 43 further comprising:

memory circuitry mounted on the printed circuit board and coupled to the integrated circuit device.

45. The printed circuit board defined in claim 44 further comprising:

processing circuitry mounted on the printed circuit board and coupled to the memory circuitry.

* * * * *